May 2, 1967

B. E. BRILEY 3,317,755

VARIABLE TIME-DELAY CIRCUIT EMPLOYING TRANSISTOR UTILIZING MINORITY-CARRIER-STORAGE EFFECT AND MODULATING A.C. SIGNAL-BIAS AT COLLECTOR FOR DETERMINING DELAY DURATION

Filed July 31, 1964

2 Sheets-Sheet 1

INVENTOR.
BRUCE E. BRILEY

BY C. A. Gulbrandsen

ATTY.

United States Patent Office 3,317,755

Patented May 2, 1967

3,317,755

VARIABLE TIME-DELAY CIRCUIT EMPLOYING TRANSISTOR UTILIZING MINORITY-CARRIER-STORAGE EFFECT AND MODULATING A.C. SIGNAL-BIAS AT COLLECTOR FOR DETERMINING DELAY DURATION

Bruce E. Briley, La Grange Park, Ill., assignor to Automatic Electric Laboratories, Inc., Northlake, Ill., a corporation of Delaware

Filed July 31, 1964, Ser. No. 386,690
4 Claims. (Cl. 307—88.5)

This invention relates to transistor delay circuits and more particularly to electronically variable delay circuits.

The conventional delay circuit depends primarily upon a resistor and capacitor for its delay period. When a resistor-capacitor delay time network is included in a vacuum tube or transistor circuit, the delay time in going from one voltage state to another voltage state is dependent upon the resistor-capacitor time constant and independent of the supply voltages which are present in the circuit.

In the known delay circuits it is difficult to realize pulse widths of less than fifty (50) nanoseconds.

It is, therefore, an object of this invention to provide a delay arrangement whose delay can be controlled by a variation of voltage.

It is another object of this invention to provide a pulse width modulator which provides pulse width variations corresponding to electronically varying voltages.

It is a further object of this invention to produce pulse widths of relatively small pulse duration.

It is still a further object of this invention to produce a pulse after an elapse of a particular electronically variable delay period.

It is yet a further object of this invention to provide a pulse-position modulator.

A feature of this invention is to apply the collector following phenomenon and minority carrier storage phenomenon of semiconductors to achieve a delay without the use of capacitors.

The above said phenomena are also discussed in my copending application "Minority Carrier Storage Flip-Flops," Ser. No. 351,999, filed Mar. 16, 1964, and my copending application "Minority Carrier Storage Delay Circuit," Ser. No. 365,766, filed May 7, 1964.

According to an embodiment of the present invention, a delay circuit is disclosed comprising a transistor network having an input circuit and an output circuit which includes an output point. A driver means is connected to the input circuit for applying a first voltage to saturate the transistor and a second voltage to subsequently cutoff the transistor. A signal means having voltage varying signals is connected to the output circuit and said signal means being dimensioned with the output circuit, the driving means, said first voltage and said second voltage to prevent the immediate discharge of the injected carriers during cutoff and to drive the voltage at said output point to a particular level for a delay period and rising thereafter to the value of said voltage varying signals; said delay period for an NPN transistor being greater with an algebraic decrease of said voltage varying signal and less for an algebraic increase of said voltage, and said delay period for a PNP transistor being less for an algebraic decrease in voltage and greater for an algebraic increase in voltage.

Other objects and a fuller understanding of the invention may be had by referring to the following description taken in conjunction with the accompanying drawings in which:

FIG. 1 illustrates a variable delay circuit wherein the delay varies in accordance with a voltage varying signal;

FIG. 2 refers to a pulse width modulating circuit wherein pulse width variations are determined by a voltage varying signal;

FIG. 3A shows a portion of a sine wave and its pulse width representation for particular points of said portion;

FIG. 3B shows a sine wave and the demodulated sine wave of the pulse width representation of such a sine wave;

FIG. 3C illustrates pulse width representations for various voltage levels of a sine wave as compared to the demodulated response of the reverse of such pulse width representation;

Figure 1:
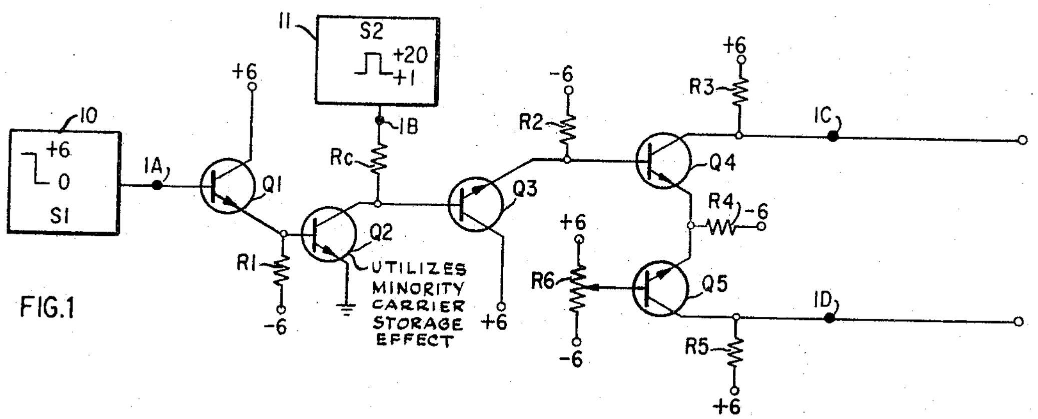

FIGURE 1 illustrates a delay circuit in which, due to the collector following effect which occurs after a transistor has been cutoff from a state of saturation, the collector voltage of Q2 after such transistor has been cutoff from a state of saturation follows the base cutoff voltage to a level near such cutoff voltage and remains there for a delay period before rising thereafter to reach the value of the voltage at point 1B. The delay is the length of time for the collector voltage of Q2 to approach the value of the voltage at the base of Q5 after the collector has been cutoff from a state of saturation. When transistor Q2 is initially saturated, minority carriers are injected therein for storage, causing, for properly dimensioned circuit parameters, the collector voltage of Q2 when the transistor is subsequently cutoff initially to drop in voltage instead of immedately starting toward the value of the voltage at point 1B. If the voltage at point 1B is small, the delay period will be large, and if the voltage at point 1B is large, the delay period will be small. The reason for the foregoing is that when the voltage is large the minority carriers during cutoff will be depleted faster than when the voltage is smaller. When the voltage at point 1B is a +1 the delay period will be much greater than when the voltage at point 1B is +20.

Refer again to FIGURE 1, the delay circuit is comprised of signal generator 10, emitter follower Q1 a minority carrier storage circuit including Q2, a collector resistor R*c*, a pulse train source 11, which is connected to the collector resistor R*c* at point 1B, a second emitter follower Q3 serving as a high impedance buffer, a switching circuit including Q4 and Q5, and a discrimination level adjuster R6. Signal S1 is applied to the emitter follower Q1 at point 1A which in turn applies a signal to Q2. When S1 is at +6 volts, Q2 becomes saturated which causes a large number of minority carriers to be injected into Q2. When S1 drops to zero volts, Q1 applies a cutoff voltage to Q2. Under the foregoing conditions, the collector of a common emitter transistor having a somewhat large collector resistor and proper voltage in the collective circuit will be observed to follow the base when such transistor is brought from a state of saturation to cutoff.

The delay is asymmetric in that a positive going input produces an essentially immediate output, while a negative going input produces a delayed output. It should be noted that the delay can be reduced to a value almost arbitrarily close to zero. A symmetrical variable delay can be produced using two of the circuits of FIG. 1 as are combined into the FIG. 5 arrangement.

In my above mentioned copending application "Minority Carrier Delay Circuit," a variable delay was described which obeyed the following approximate equation:

$$R=\frac{V}{Q}\tau e^{\tau/\tau'}$$

where:

$R$=collector resistance
$V$=collector supply voltage
$Q$=excess stored charge
$\tau$=delay time
$\tau'$=effective minority carrier lifetime.

Now consider R as fixed and V as variable. Then, for example, halving V should have the same effect upon $\tau$ as doubling R.

It was found experimentally that a two-to-one ratio in delay could be obtained easily with a 6 volt change in voltage. If a larger ratio would be desirable a varistor could be used as the collective resistor of Q2. Varistors have a resistance governed approximately by $$I=KV^{n}$$

where:

$I$=current in amperes
$V$=voltage in volts
$n$=a dimensionless exponent
$K$=a proportionality constant Thus, the previously given relation becomes $$\frac{1}{K}=v^{n}\tau e^{\tau/\tau'}$$

so that a small change in voltage has a profound effect upon delay for large $n$.

Larger voltage changes bring about greater delay ratios, e.g., 10:1 for a linear resistor, 24:1 with a varistor for voltage changes from 1 to 20 volts.

In FIG. 1, for a discrimination level slightly above ground which is set by variable resistor R6, the following occurs. When S1 is at +6 volts, Q2 becomes saturated and the collector of Q2 is driven virtually to ground which drives emitter follower Q3 more negative than it was previously and causing thereby Q4 to become cutoff and Q5 to saturate. As S1 drops from +6 volts to zero, Q2 becomes cutoff but the collector of Q2, instead of rising towards the level of the voltage generated from source 11, drops and follows the base cutoff voltage to a negative level. When the collector of Q2 is at such a negative voltage, Q4 and Q5 remain in their switched state. If source 11 is at a voltage of +1, the time that the collector of Q2 will remain at the negative level will be much longer than the time it would remain when source 11 is at a +20 volts. When the collector voltage of Q2 rises toward the value of the voltage at 1B, Q4 and Q5 will switch back to their original state.

When the collector resistor of Q2, Rc is 47K, the delay period at points 1C and 1D will be 10 microseconds for a voltage of +1 v. at point 1B and a delay 1 microsecond for a voltage of +20 v. at point 1B.

When variable resistor R6 is set at a discriminator level slightly below ground, Q4 and Q5 will switch states when the collector of Q2 goes negative after being cutoff from a state of saturation.

With a varistor of $K=1.47\times10^{-6}$ and $N=3.05$, $\tau$ for a voltage of +1 at point A is 12$\mu$s for a voltage at point 1B of 20 v. If during the saturation of Q2 the voltage at point 1B is 1 volt and 20 volts during cutoff, the delay period would be somewhere between the delay if the point 1B had 1 v. or 20 v. during both saturation and cutoff.

Since the collector resistance of Q2 is usually large, the input impedance of the grounded emitter transistor would also be quite high.

Thus, the delay can be controlled automatically by a voltage at electronic speeds, and the circuit becomes a logic element useful in computer controls.

Figures 2, 3A:
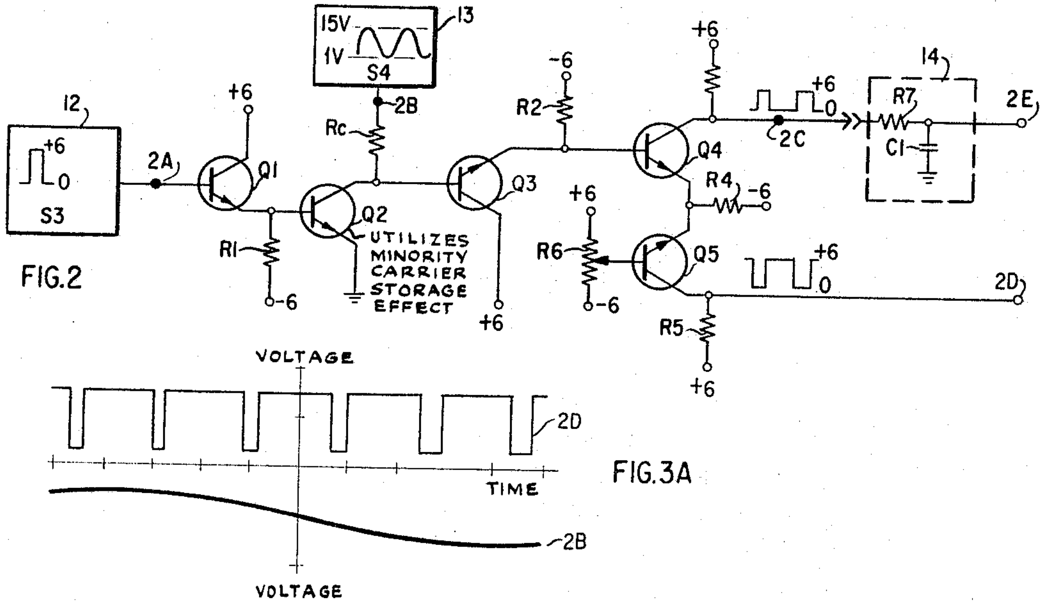
FIGS. 3A, 3B and 3C illustrate the various wave responses for the pulse width modulating circuit of FIG. 2.

The circuit illustrated in FIG. 2 comprises a pulse generator 12 generating a train of pulses for application to point 2A and the base of emitter follower Q1, a minority carrier storage circuit including Q2, a sine wave voltage S4 from generator 13 being applied to point 2B, an emitter follower Q3, a switching circuit including transistor Q4, transistor Q5, and a level adjuster R6, and demodulator circuit 14 which could be connected to point 2C for demodulating the pulse width back to the sine wave representation of S4.

In FIG. 2 emitter follower Q1 responds to S3 and applies a signal to the base of Q2 so that when the pulses of S3 are at their maximum level Q2 becomes saturated and when the pulses drop to their low point of reference, Q2 becomes cutoff. The sine wave at point 2B determines the time it takes for the collector of Q2 to rise to the level of the sine wave voltage after being cutoff from a state of saturation. The delay time is the time it takes for the collector of Q2 after Q2 has been cutoff from a state of saturation to approach the value of the voltage at point 2B and such delay time will vary with the variations of the sine wave.

The magnitude and width of the pulses at the collector of Q2 after Q2 is cutoff from a state of saturation will vary in accordance with the variations of the voltage at point 2B. Transistors Q4 and Q5 respond to variations of the collector of Q2 so that the outputs at point 2C and 2D display pulse width representations of sine wave S4.

The setting of resistor R6 of FIG. 2 to a discrimination level slightly below ground will cause Q4 and Q5 to change state when the collector of Q2 follows the base cutoff voltage after Q2 is cutoff from saturation. When a pulse from the S3 pulse train is applied to the base of Q1, transistor Q2 becomes saturated to a value near ground when such pulse is at its more positive voltage level. Transistor Q3 varies with the collector of Q2 and applies a voltage to the base of Q4. The outputs at points 2C and 2D remain unchanged since the discriminator level has been set slightly below ground. As the pulse goes from its more positive level to its minimum or least positive level, emitter follower Q1 applies a voltage to the base of transistor Q2 which cuts off Q2. The collector of transistor Q2, instead of rising towards value of the sine wave at point 2B, follows the base cutoff voltage to a value near such cutoff voltage or below. Emitter follower Q3 follows the collector of Q2 and applies a voltage less than ground to the base of Q4 causing the outputs of Q4 and Q5 to then change state. The collector of Q2 remains at a value near the cutoff voltage or less than ground for a delay period and then rises toward the value of the sine wave voltage at point 2B. Transistors Q4 and Q5 remain in the changed state until the collector of Q2 passes the critical point to which resistor R6 has been set thereby causing Q4 and Q5 to return to their original state. Each pulse of signal S3 causes transistor Q2 to saturate and to subsequently become cutoff. The length of time that the collector of NPN transistor Q2 will remain at a negative value is dependent upon the varying sine wave signal at point 2B. When the sine wave at one increment of time is at a greater voltage with respect to ground than at another increment of time, the delay period will be less, and the delay period will be greater when the sine wave voltage is at a lesser voltage. Therefore, the length of time that the outputs of Q4 and Q5 will remain in their switched states will be dependent upon the length of time that the collector of Q2 will be delayed before approaching the value of the sine wave signal. The outputs of points 2C and 2D give a pulse width representation of the sine wave at point 2B. When the pulses at points 2C and 2D have a relatively long pulse width, the sine wave is at its lower voltage point. When the pulses are narrow, the sine wave is at its high amplitude point. The demodulator circuit 14 which could be applied to point 2C and including R7 and C1 converts such pulse width signals back into an amplitude representation of the sine wave signal.

The signal at point 2B is a sine wave but could be any voltage varying signal as a voltage from a microphone activated by speech. The signal at point 2A is a pulse train having pulses spaced apart so that there will be a sampling of the sine wave at least two times per cycle. The width of the pulses at point 2A are therefore immaterial except for the fact that at least two samplings of the sine wave are required. The signals are points 2C and 2D are dependent upon the pulses applied to point 2B and the amplitude of the sine wave at point 2A.

When R6 is set for a discrimination level slightly below ground, points 2C and 2D indicate a change of state when the input pulse to point 2A causes transistor Q2 to cutoff.

Figure 3B:
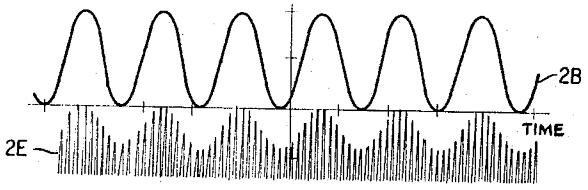
Figure 3C:
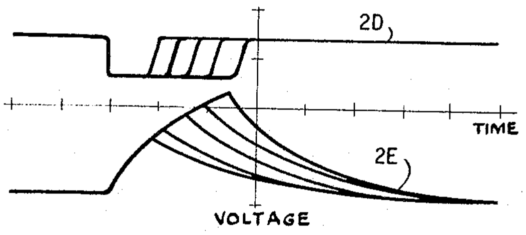

FIG. 3 illustrates the pulses of the pulse width modulator of the circuit of FIG. 2 for a 6 kc. sine wave frequency applied to point 2B and a 50 kc. pulse frequency connected to point 2A. FIG. 3A shows variations of pulses at the output point 2D for the variations in amplitude of the sine wave at point 2B. The decreasing of the amplitude of the sine wave results in a longer pulse at point 2D due to Q5 remaining longer in its switched state when the potential at point 2B is less. FIGURE 3B compares the sine wave at point 2B witht he demodulator sine wave signal at point 2E. As is shown, the pulse width modulation achieved through minority carrier storage translating the sine wave signals into pulse width signals and the demodulator translating such pulse width signal back into a sine wave is substantially equivalent to the sine wave at 2B. FIG. 3C compares the pulse width modulated signals at point 2D with an inverse of such pulses demodulated at point 2E. The FIG. 3 measurements were taken with all pulses triggering from the same point on the scope. As is shown, the longer the pulse width the greater the amplitude of the demodulated signals.

In FIG. 3, signals S4 applied at point 2B will be sampled by the pulse train connected to point B and will produce at the output of 2C and 2D a train of pulses of varying width. The pulse width modulated signals at point 2D are demodulated at point 2E to reproduce the S4 voltage varying signals. The amplitude of signal S4 must be such that its negative peak does not go below approximately one volt. If it were to go below one volt there is the risk of the transistor ceasing to act as a transistor.

Let the $n$th Fourier component of the sampled signal be $$V=V_0 \cos (nwt)$$

Then $$\tau_s R Q_o = \tau e^{\tau/\tau'} \int_{t=t_a}^{t=t_b} V_o \cos (nwt) dt$$

where:

$\tau_s$=the sampling material interval $(t_c-t_a)\approx\tau$
$\tau$=width of output pulse
$\tau'$=effective minority carrier lifetime
R=collector resistance
$Q_0$=excess stored charge.

For $\tau_S \ll w/2\pi$, the following approximation is valid:

$$RQ_0 = \tau e^{\tau/\tau'} V_0 \cos (nwt)$$
$$= \tau V_0 \cos (nwt) \text{ for } \tau' \text{ very large}$$

Thus, the output pulse width is related approximately hyperbolically to the instantaneous sampled value of the input voltage.

Figure 4:
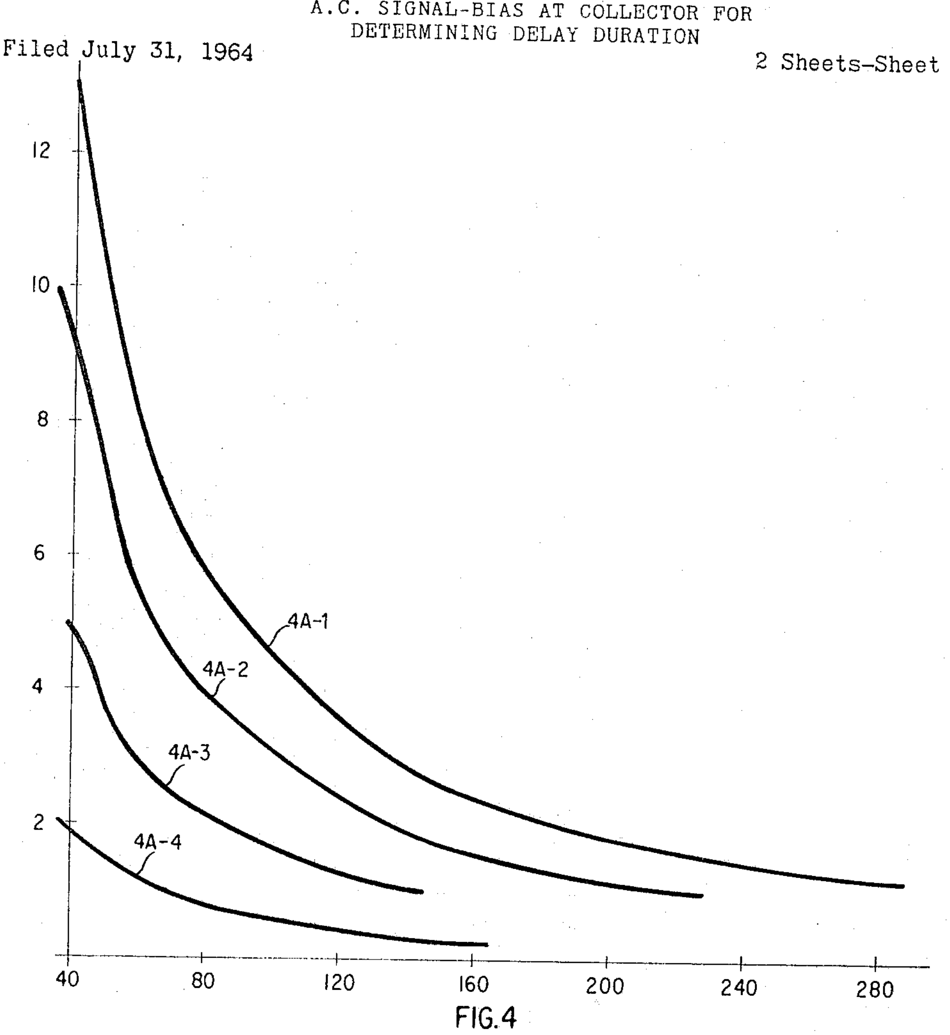
FIG. 4 shows curves of the changes in pulse width for variations in collector voltage of a transistor producing the collector following effect. For each curve the collector resistance for such transistor is held at a certain constant value.

The curves in FIG. 4 of pulse width in nanoseconds versus collector voltage were derived from experimental data which verified the above equations that $RQ_0$ is approximately equal to $V_0\tau$. The pulse width referred to is the time necessary for transistor Q2 of FIG. 1 or FIG. 2 to approach the voltage level of the Q2 collector supply after such transistor had been cutoff from a state of saturation for a particular level of collector supply voltage and a particular level of collector resistor. Curve 4A–1 shows the delay period for collector resistance of 10K and a voltage range from 13 v. to 1 v.; curve 4A–2 for collector resistance of 6–8K and a voltage range from 13 v. to 1 v.; curve 4A–3 for a collector resistance of 4.7K and a voltage range from 5 v. to 1 v.; curve 4A–4 for a collector resistance of 2.2K and a voltage range from 2 v. to 0.2 v. The transistor used for Q2 was a selected 2N706 being of the type which gave an average delay period after being cutoff from a state of saturation for the same collector resistance and collector supply voltage.

The pulse width modulator using the collector following phenomenon could be controlled to provide pulse widths of less than fifty nanoseconds. Referencing the circuit of FIG. 1, narrower pulse widths could be obtained by increasing the voltage at point 1B, and decreasing the resistance of RC and using a transistor for Q2 which has a rapid switching time. A delay of under forty nanoseconds could be produced by using a 2N706 for Q2, +5 v. at point 1B and a resistance of 4.7K for RC; a +10 v. at point 1B for an RC of 6.8K will produce a delay of under forty nanoseconds. The lower the resistance for RC and the greater the supply voltage being applied at point 1B the shorter the delay. The curves in FIG. 4 also indicate other combinations of collector resistance and collector supply voltage where pulses of widths under forty nanoseconds could be realized. The advantage of having narrower pulse width representations of signal amplitudes is that more pulse width coding of amplitude variation could be made per unit of time than if the pulse widths were longer.

Figure 5:
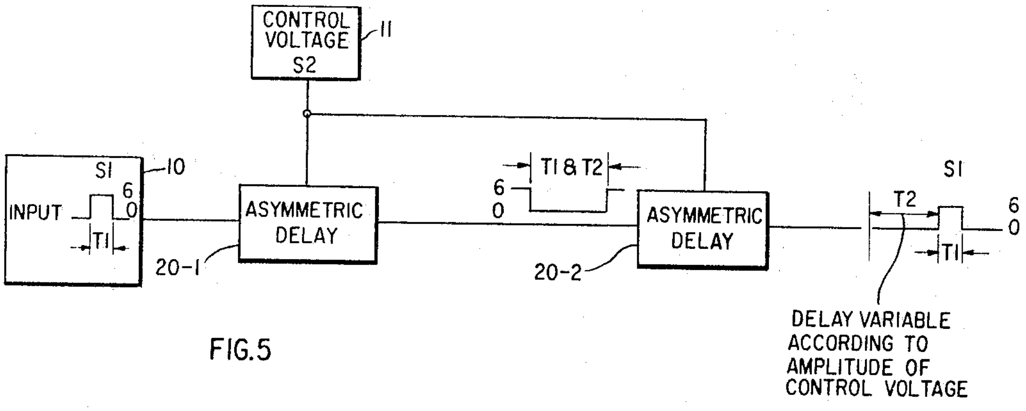
FIG. 5 illustrates a logic circuit providing a logic element wherein the input pulse and its inverse are reproduced after a particular delay period—a pulse position modulator.

FIG. 5 shows a logic circuit which reproduces the input pulse S1 after the lapse of a particular delay time and thereby providing a new logic element. The input source 10 applies an input pulse S1 having a T1 pulse width into the asymmetrical delay circuit 20–1. The output of 20–1 is coupled into an identical asymmetrical delay circuit. The asymmetrical delay circuits of FIG. 5 are identical to the circuit of FIG. 1 which, as will be clear from the above description, is the same as that of FIG. 2 internally of terminals 1A or 2A, 1B or 2B, 1C or 2C, and 1D or 2D, and their discriminator levels are set at slightly above ground with resistor R6. The output of the second delay circuit produces the S1 pulse displaced from the input S1 pulse by a time T2. FIG. 5 will be discussed with reference to the circuit of FIG. 1. When the discriminator level is set above ground, the positive portion of signal S1 will cause Q2 to saturate and the outputs of Q4 and Q5 to change state. When the S1 signal goes negative, Q2 will cutoff and the collector of Q2 will follow the base voltage for a time T2 before approaching the collector supply voltage. Transistors Q4 and Q5 will remain in their switched states until the Q2 collector voltage crosses over the discriminator switching point to approach the supply voltage. Therefore, Q4 and Q5 will change state after a time T1 and T2. The pulse output of Q5 having a zero voltage level for a time T1 plus T2 is coupled into the input of the second asymmetrical delay 20–2 and such pulse will cutoff Q2 of the second delay circuit 20–2 for a time T1 plus T2. The collector voltage of Q2 will follow the base cutoff voltage for a time T2 since the delay of 20–2 is the same as 20–1. After a time T2, Q4 and Q5 will switch state and remain in such switched state for T1 duration. After such duration the input pulse into 20–2 rises to its positive level to saturate Q2 and to cause thereby Q4 and Q5 to switch back to their previous voltage levels. The effect of the placing in series of the identical asymmetrical networks is to reproduce the S1 signal at the output of Q5 and its inverse at the output of Q4 after a delay of time T2. The T2 delay is controlled electronically by the voltage amplitude at point 1B. Therefore, these logic elements produced at the output of 20–2 could be placed along a transmission path in accordance with the delay controlled by the voltage at 1B. In effect a pulse position modulator is produced.

The application of the collector following phenomenon of junction type semiconductors depends upon an adequate supply of minority carriers being injected into the transistor when saturated, and stored during cutoff. When saturation occurs, the base current is approximately equal to the emitter current and the collector current is small by comparison. Transistor saturation is a condition in which both the emitter and collector junctions are forward biased. Considering an NPN saturated transistor, the emitter current being heavy, a high level injection of electrons takes place at the emitter-base junction. Since the base region is made physically narrower than the emitter or collector, the electrons flowing through the emitter base barrier will experience a low mortality rate, in that, very few of the total electrons will merge with the holes of the P type base material to form an electron-pair bond. The electrons not combining with the holes of the base will diffuse into the collector. The excess flow of electrons to the collector has a forward biasing effect on the collector-base junction causing a low net rate of flow of charge which at equilibrium equals the collector current, and is much less than the emitter current.

When the base potential of a saturated junction transistor is rapidly reduced to a level below that of the emitter, the emitter base junction becomes reverse biased while the collector base junction remains forward biased. The collector, if the collector resistance connected between the collector and a positive voltage source is somewhat large, will follow the base voltage instead of immediately rising toward the positive external voltage or remain for a time unchanged, because the current necessary to change the collector-base junction potential appreciably is not available. The length of time that the collector potential remains essentially constant is called the delay time or storage time. Delay time results from a large number of minority carriers being stored in the base and collector region of the transistor at the moment when the input current is cutoff. If an NPN transistor is saturated and suddenly cutoff, the electrons would be the excess minority carriers in the base and holes the excess minority carriers in the collector. The carriers affecting storage time require a definite time to be collected which is a function of the degree of saturation. Therefore, the delay could be avoided by biasing the transistor so that it goes from cutoff into an active state rather than saturation. However, in the electronically variable delay arrangements of FIGS. 1 and 2, the storage effect of carriers is utilized to bring about the desired result.

When the transistor is cutoff after being saturated, the excess charge in the base and collector is removed by recombination and collector-base current. Thus, the minority carrier storage effect consists of storing charge with a low impedance source, and removing it with a high impedance sink and recombination.

An approximate expression for the charge remaining during the period of collector-base forward bias is:

$$Q=Q_0e^{-t/\tau'}-\int_0^t i_c dt$$

where:

$Q_0$ is the total excess charge stored
$\tau'$ is the effective lifetime of minority carriers
$i_c$ is the collector current.

Since $i_c$ is, to a good approximation, constant during the period of forward bias, $$Q=Q_0e^{-t/\tau'}-It$$

Of interest is the time $\tau$ necessary to reduce this charge to 0 (zero), satisfying $$0=Q_0e^{-\tau/\tau'}-I\tau$$

Noting that the current I is given by $$I=\frac{E+V_u}{R}=\frac{V_0}{R}$$

where:

$E$=collector supply voltage
$V_u$=undershoot voltage, the following expression may be written relating delay time to collector resistance:

$$R=\frac{V_0}{Q_0}\tau e^{\tau/\tau'}$$

Where $V_0$ is equal to the sum of the collector supply voltage and the undershoot voltage $V_u$ (maximum negative voltage at cutoff for an NPN transistor).

Recognizing that the slope of an exponential is proportional to its initial value, and that recombination will take place throughout the semi-conductor, and superposition should not be applied in combining non-linear effects, the following approximations are made to warrant the expression used above for charge remaining during collector forward bias.

(1) Recombination and charge recovery are independent processes.

(2) The ratio of the charge annihilated during recovery to that annihilated during decay is large.

(3) The various decay processes may be lumped into an effective minority-carrier lifetime.

These approximations can be justified on the basis of the following:

(1) It will be seen that this approximation is good for all $\tau$ whenever one effect is much greater than the other; thus, in particular, the expression is correct for either (or trivially, both) effect absent.

In addition, the approximation is good for small $\tau/\tau'$ even if the effects are of comparable magnitude.

(2) This approximation is reasonable under most conditions, but becomes especially good for low $\tau'$ and/or high extraction current.

(3) This approximation is usual.

Also the charge expression can be shown to be an approximation of that derived by Yohan Cho for a long-base diode in a paper titled "A Method of Theoretical Analysis of High Speed Junction Diode Logic Circuits," appearing in the October 1963 "IEEE Transactions on Electronic Computers."

As the above equation indicates, a relationship exists between the collector resistance R, and the time $\tau$, necessary to reduce the charge stored in the transistor during saturation to zero. The equation was verified by plotting a curve $\tau$ versus R with values of $\tau$ measured with a scope of the collector voltage waveform during cutoff immediately following saturation; then taking two points from the curve and using the R and $\tau$ values therefrom to provide two equations for $$R=\frac{V_0}{Q_0}\tau e^{\tau/\tau'}$$

in order to solve for the constants $V_0/Q_0$ and $\tau'$; then calculating $\tau$ for given values of R to compare calculated $\tau$ with the measured $\tau$ of the $\tau$ versus R curve. It was found using transistors 2N1613, 2N1302, 2N706 and 2N2476 that the measured $\tau$ and calculated $\tau$ for each was substantially equivalent. Below are listed the values of constants $V_0/Q_0$ and $\tau$:

| | $V_0/Q_0$ (Ω/sec.) | $\tau'$ (μsec.) |
|---|---|---|
| 2N1613 | 1.51 | 2.63 |
| 2N1302 | 15.92 | 4.2 |
| 2N706 and 2N2476 | 78.0 | 27.3 |

Since $V_0$ is constant for all cases, it can be seen that the list is in order of decreasing $Q_0$, but increasing $\tau'$; in view of the increasing order of speed, the former result was expected and the latter unexpected.

In the table below the R and $\tau$ relationship is indicated. Both $\tau$ measured and $\tau$ calculated are shown.

| R | 2N1613 | | 2N1302 | | 2N706 and 2N2476 | |
|---|---|---|---|---|---|---|
| | $\tau$ meas. | $\tau$ cal. | $\tau$ meas. | $\tau$ cal. | $\tau$ meas. | $\tau$ cal. |
| 47K | 4.9 μs. | 4.9 μs. | 1.8 μs. | 1.9 μs. | .6 μs. | .6 μs. |
| 82K | 5.7 μs. | 5.8 μs. | 2.5 μs. | 2.7 μs. | 1.0 μs. | 1.1 μs. |
| 120K | 6.5 μs. | 6.5 μs. | 3.2 μs. | 3.4 μs. | 1.5 μs. | 1.6 μs. |

The base and collector regions will have minority-carrier lifetimes which will differ because of differences in impurity concentrations and carrier type. Since the resistivity of the collector region is considerably greater than that of the base, the lifetime of minority carriers will, in general, be greater in the collector than in the base. Based upon this, the following theory will be advanced: in a 2N1613, the majority of excess charge storage is in the base region, while in the 2N706 and 2N2476, it is in the collector. It should be noted that each of the above types used was a planar, double-diffused epitaxial silicon transistor. The 2N1302 was an alloy-junction germanium transistor.

Some typical values of the circuit in FIG. 1 are given: R1 is 120 ohm, Rc is 22K, R2 is 10K, R3 is 1.5K, R4 is 1.0K, RS is 1.5K, R6 is a variable resistor of a 10K value; Q1 is a 2N2476, Q2 is a 2N613, Q3 is a 2N706, Q4 is a 2N706, Q5 is a 2N706. Signal S1 has sufficient voltage levels to cause the emitter of Q1 to apply signals to saturate and subsequently cutoff Q2. Signal S2 is of sufficient magnitude to electronically vary the delay at the output of Q2 when the transistor is cutoff from a previous state of saturation. If the voltage is too large such voltage would prevent the collector following phenomenon from occurring; if the voltage is too small it would prevent the transistor from acting as a transistor. The typical values of FIG. 1 for resistors and transistors would apply also to FIG. 2. The demodulator circuit 14 includes R7 at 15K and C1 at 200 picofarads. Variable amplitude signal S4 has the same limitations regarding its amplitudes as S2.

While the present invention has been described with respect to particular embodiments, this description is intended in no way to limit the scope of the invention.

What is claimed is:

1. A pulse width modulating circuit comprising:

a transistor having a base, emitter and collector electrode;

driver means connected to said base electrode and providing a train of pulses whose voltage alternates between a first value for saturating said transistor, whereby a large number of minority carriers are injected into the junction between said base and emitter electrodes, and a second value for initiating cut-off of said transistor, and means connected to said collector electrode providing a modulating signal of the analog or slowly varying amplitude type, said modulating signal being dimensioned in relation to the other parameters of the circuit so that upon application of said second voltage, the immediate discharge of said injected carriers is prevented and the voltage at said collector electrode is caused to move towards a level near said second voltage with a predetermined delay before moving in the direction of the instantaneous voltage of said modulating signal, each of said pulses of said pulse train alternately causing immediate saturation and delayed cut-off of said transistor, each said delay differing in duration in accordance with the amplitude of said modulating signal.

2. A pulse width modulating circuit as claimed in claim 1, wherein said circuit includes a discriminator network having an input and an output, said input being connected to said collector electrode, and said output having a first and second state and being switched from said first state to said second state, and vice versa, in response to the changes in the collector voltage of said transistor to provide a train of pulses of equal magnitude but varying in width in accordance with the amplitude of said modulating signal.

3. A pulse width modulating circuit including a transistor utilizing minority carrier storage, said transistor having a base, emitter and collector electrode, and being controlled by a train of pulses applied to said base electrode to saturate said transistor each time one of said pulses changes said base voltage from a first to a second value and to initiate cut-off of said transistor each time one of said pulses changes said base voltage from said second to said first value, a source of modulating voltage of the analog or slowly varying amplitude type connected to the collector electrode of said transistor, said modulating voltage being dimensioned with the other circuit parameters to prevent the immediate recombination of said minority carrier so that a predetermined period elapses between the last-mentioned change of said base voltage and the time when the collector electrode of said transistor nears the instantaneous amplitude of said modulating voltage, and said circuit also including a discriminator-inverter connected to the collector electrode of said transistor and having an output which is switched from a first to a second state, and vice versa, to provide a train of pulses of substantially equal magnitude but changing in width in accordance with the amplitude of said modulating signal.

4. A pulse position modulating arrangement comprising:

two pulse width modulating circuits, each said circuit including a transistor utilizing minority carrier storage, said transistor having a base, emitter and collector electrode, and being controlled by a train of pulses applied to said base electrode to saturate said transistor each time one of said pulses changes said base voltage from a first to a second value and to initiate cut-off of said transistor each time one of said pulses changes said base voltage from said second to said first value, a source of modulating voltage of the analog or slowly varying amplitude type connected to the collector electrode of said transistor, said modulating voltage being dimensioned with the other circuit parameters to prevent the immediate recombination of said minority carriers so that a predetermined period elapses between the last-mentioned change of said base voltage and the time when the collector electrode of said transistor nears the instantaneous amplitude of said modulating voltage, and each said circuit also including a discriminator-inverter connected to the collector electrode of said transistor and having an output which is switched from a first to a second state, and vice versa, to provide a train of pulses of substantially equal magnitude but changing in width in accordance with the amplitude of said modulating signal, said two pulse width modulating circuits being connected in tandem, with the output of the discriminator-inverter of said first circuit connected to the base electrode of the transistor of said second circuit, whereby upon the application to the base electrode of the transistor of said first circuit, of a train of input pulses each effecting said first mentioned change in base voltage for a certain time interval, there will appear at the base of the transistor of said second circuit a train of inverted pulses each of a width corresponding to the sum of said certain time interval and said predetermined period, and there will appear at the output of the discriminator-inverter of said second circuit, a sequence of output pulses each having the same direction and duration as each of said input pulses, but delayed in occurrence by said predetermined period, said period being dependent on the instantaneous amplitude of said modulating voltage.

References Cited by the Examiner

UNITED STATES PATENTS

| | | | |
|---|---|---|---|
| 3,018,389 | 1/1962 | Herscher | 307—88.5 |
| 3,047,739 | 7/1962 | De Miranda | 307—88.5 |
| 3,048,714 | 8/1962 | Poole | 307—88.5 |
| 3,050,640 | 8/1962 | Dillingham et al. | 307—88.5 |

ARTHUR GAUSS, *Primary Examiner.*

J. HEYMAN, *Assistant Examiner.*